US009749572B2

(12) United States Patent
Raynor

(10) Patent No.: US 9,749,572 B2
(45) Date of Patent: Aug. 29, 2017

(54) READ-OUT CIRCUITRY FOR AN IMAGE SENSOR

(71) Applicant: STMicroelectronics (Research & Development) Limited, Marlow, Buckinghamshire (GB)

(72) Inventor: Jeffrey M. Raynor, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 0 days.

(21) Appl. No.: 15/479,764

(22) Filed: Apr. 5, 2017

(65) Prior Publication Data

US 2017/0208279 A1    Jul. 20, 2017

Related U.S. Application Data

(60) Continuation of application No. 15/242,835, filed on Aug. 22, 2016, which is a division of application No. (Continued)

(30) Foreign Application Priority Data

Nov. 29, 2013    (GB) .................................. 1321062.0

(51) Int. Cl.
*H04N 5/378*    (2011.01)
*H04N 5/345*    (2011.01)
(Continued)

(52) U.S. Cl.
CPC ........... *H04N 5/378* (2013.01); *G11C 11/419* (2013.01); *H03M 1/002* (2013.01); *H03M 1/123* (2013.01); *H03M 1/1245* (2013.01); *H04N 5/345* (2013.01); *H04N 5/3452* (2013.01); *H04N 5/3454* (2013.01); *H04N 5/3456* (2013.01); *H04N 5/3698* (2013.01);
(Continued)

(58) Field of Classification Search
CPC ............. H04N 5/3698; H04N 5/37455; H04N 5/3742; H04N 5/376; H04N 5/3765; H04N 5/378; H03M 1/123; H03M 1/1245
See application file for complete search history.

(56) References Cited

U.S. PATENT DOCUMENTS 8,179,465 B2    5/2012  Tanaka
9,462,207 B2    10/2016  Raynor
(Continued)

FOREIGN PATENT DOCUMENTS

GB    2498529 A    7/2013

OTHER PUBLICATIONS

UK—IPO Search Report for GB1321062.0 dated Apr. 30, 2014 (5 pages).

*Primary Examiner* — Daniel M Pasiewicz
(74) *Attorney, Agent, or Firm* — Gardere Wynne Sewell LLP

(57) ABSTRACT

An array of image sensing elements is arranged in rows and columns. A readout circuit for each column includes a circuit configured to receive a column select signal. A memory stores data indicative of a voltage of an image sensing element which is being read. An analog to digital conversion circuit provides an output to the memory to control the storing of data. The output is dependent on the voltage of the image sensing element. Power control circuitry operates to disable, at least partially, the analog to digital conversion circuit when the column has not been selected.

8 Claims, 17 Drawing Sheets

Related U.S. Application Data

14/552,705, filed on Nov. 25, 2014, now Pat. No. 9,462,207.

(51) Int. Cl.

| | | |
|---|---|---|
| *H04N 5/91* | (2006.01) | |
| *H04N 5/376* | (2011.01) | |
| *H04N 5/369* | (2011.01) | |
| *G11C 11/419* | (2006.01) | |
| *H03M 1/12* | (2006.01) | |
| *H03M 1/00* | (2006.01) | |
| *H03M 1/56* | (2006.01) | |

(52) U.S. Cl.
CPC ............ *H04N 5/3765* (2013.01); *H04N 5/91* (2013.01); *H03M 1/56* (2013.01)

(56) References Cited

U.S. PATENT DOCUMENTS

| | | |
|---|---|---|
| 2009/0040350 A1 | 2/2009 | Yamauchi |
| 2009/0166513 A1 | 7/2009 | Abe et al. |
| 2010/0225796 A1 | 9/2010 | Lim et al. |
| 2012/0199724 A1 | 8/2012 | Nomura et al. |
| 2013/0182164 A1 | 7/2013 | Duggal et al. |
| 2014/0232932 A1 | 8/2014 | LiKamWa et al. |
| 2015/0146037 A1 | 5/2015 | Keelan |
| 2015/0171884 A1 | 6/2015 | Tsukuda et al. |
| 2016/0028985 A1 | 1/2016 | Vogelsang et al. |

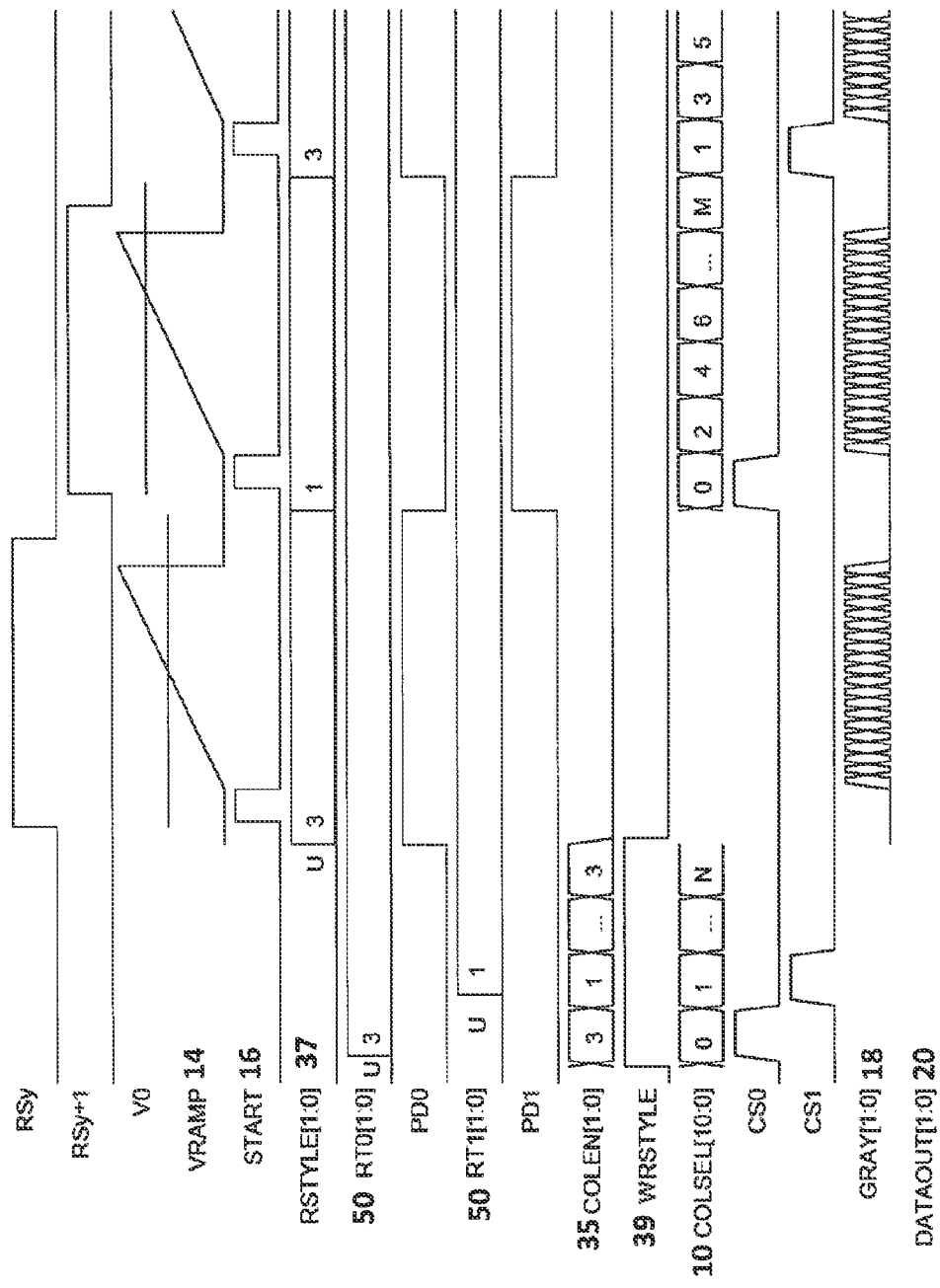

Figure 14

| Mode 1 | Enable Row #N | ADC Row #N | Readout Row #N | Enable Row #N+1 | ADC Row #N+1 | Readout Row #N+1 | Enable Row #N+2 | ADC Row #N+2 | Readout Row #N+2 |
|---|---|---|---|---|---|---|---|---|---|

| Mode 2 | Enable Row #N | ADC Row #N | Readout Row #N-1 | Enable Row #N+1 | ADC Row #N+1 | Readout Row #N | Enable Row #N+2 | ADC Row #N+2 | Readout Row #N+1 | Enable Row #N+3 | ADC Row #N+3 | Readout Row #N+2 |
|---|---|---|---|---|---|---|---|---|---|---|---|---|

| Mode 3 | Enable Row #N | ADC Row #N | Readout Row #N-1 | Enable Row #N+1 | ADC Row #N+1 | Readout Row #N | Enable Row #N+2 | ADC Row #N+2 | Readout Row #N+1 | Enable Row #N+3 | ADC Row #N+3 | Readout Row #N+2 |
|---|---|---|---|---|---|---|---|---|---|---|---|---|

| Mode 4 | Enable Row #N | ADC Row #N | Ena/Disa Columns | Readout Row #N | Enable Row #N+1 | ADC Row #N+1 | Ena/Disa Columns | Readout Row #N+1 | Enable Row #N+2 | ADC Row #N+2 | Ena/Disa Columns |
|---|---|---|---|---|---|---|---|---|---|---|---|

| Mode 5 | Enable Row #N | ADC Row #N | Readout Row #N | Ena/Disa Columns | Enable Row #N+1 | ADC Row #N+1 | Readout Row #N+1 | Ena/Disa Columns | Enable Row #N+2 | ADC Row #N+2 | Readout Row #N+2 | Ena/Disa Columns | Enable Row #N+3 | ADC Row #N+3 |
|---|---|---|---|---|---|---|---|---|---|---|---|---|---|

| Mode 6 | Define Ena/Disa Columns Style#0 | Define Ena/Disa Columns Style#1 | Enable Row #N | ADC Row #N-1 | Readout Row #N-1 RowStyle =3 | Enable Row #N+1 | ADC Row #N | Readout Row #N RowStyle =1 | Enable Row #N+2 | ADC Row #N+1 | Readout Row #N+1 RowStyle =0 | Enable Row #N+3 | ADC Row #N+2 | Readout Row #N+2 RowStyle =1 |
|---|---|---|---|---|---|---|---|---|---|---|---|---|---|---|

US 9,749,572 B2

READ-OUT CIRCUITRY FOR AN IMAGE SENSOR

CROSS REFERENCE TO RELATED APPLICATIONS

This application is a continuation application from U.S. application for Ser. No. 15/242,835 filed Aug. 22, 2016, which is a divisional application from U.S. application for Ser. No. 14/552,705 filed Nov. 25, 2014 (now U.S. Pat. No. 9,462,207 issued Oct. 4, 2016), which claims priority from Great Britain Application for Patent No. 1321062.0 filed Nov. 29, 2013, the disclosures of which are incorporated by reference.

TECHNICAL FIELD

Some embodiments relate to image sensors and in particular but not exclusively to CMOS (complimentary metal-oxide semiconductor) image sensors.

BACKGROUND

Image sensors using photo diode pixels, for example implemented in a CMOS architecture, are known. An image sensor is a device comprising one or more radiation sensitive elements having an electrical property that changes when radiation is incident upon the radiation sensitive elements, together with circuitry for converting the changed electrical property into a signal. As an example, an image sensor may comprise a photo detector that generates a charge when radiation is incident on that photo detector. The photo detector may be designed to be sensitive to electromagnetic radiation in the range of (human) visible wavelengths, or other neighboring wavelength ranges, such as infrared or ultra violet, for example.

An array is made up of a number of pixels, each pixel having one or more radiation sensitive elements and optionally other circuitry. An array may comprise pixels arranged in a row and column configuration.

SUMMARY

According to an aspect, there is provided a readout circuit for a column of an array of image sensing elements arranged in rows and columns, said read out circuit comprising: circuitry configured to receive a column select signal; memory configured to store data indicative of a voltage of an image sensing element which is being read; analog to digital conversion circuitry configured to provide an output to said memory to control the storing of said data, said output being dependent on said voltage of said image sensing element; and power control circuitry configured to disable, at least partially, said analog to digital conversion circuitry when said column has not been selected.

According to another aspect, there is provided an image sensor arrangement comprising: an array of image sensing elements arranged in rows and columns: and a read out circuit as discussed above.

In the above, many different embodiments have been described. It should be appreciated that further embodiments may be provided by the combination of any two or more of the embodiments described above.

In an embodiment, a circuit is provided for read out from an image array including a plurality of column lines. The circuit comprises, for each column line: an analog-to-digital conversion circuit having an input coupled to the column line, said analog-to-digital conversion circuit enabled for operation in response to a conversion enable signal; a control circuit configured to generate said conversion enable signal, the control circuit comprising: a first control circuit having a data input configured to receive a first column enable signal, an enable input configured to receive a first row style signal and a data output configured to generate a first output enable signal; and a second control circuit having a data input configured to receive a second column enable signal, an enable input configured to receive a second row style signal and a data output configured to generate a second output enable signal; wherein the conversion enable signal is derived from the first and second output enable signals; and wherein the first row style signal specifies a first pattern of column lines for read from the image array and wherein the second row style signal specifies a second pattern of column lines for read for read from the image array.

Various other aspects and further embodiments are also described in the following detailed description and in the attached claims.

BRIEF DESCRIPTION OF THE DRAWINGS

For a better understanding of some embodiments, reference will now be made by way of example only to the accompanying drawings in which:

FIG. 10 shows a timing diagram;
FIG. 14 shows an overview of different modes.

DETAILED DESCRIPTION OF THE DRAWINGS

Some embodiments may provide a sensor array which can operate at a wide range of resolutions. The sensor array comprises an array of pixels arranged in Y rows and X columns.

Some current sensors operate in a limited number of resolution modes (e.g. full resolution {Xmax*Ymax}, half (linear) resolution {Xmax/2*Ymax/2}, 640*480 for view finder etc.). In some image sensors all the columns are enabled in all modes. This may consume significant power.

In for example binning, signals from adjacent columns may be combined. In this scenario a pre-set pattern of columns may be disabled to save power. This technique may not be acceptable, for example, for machine vision applications. For machine vision applications, it may be desirable to have the resolution and/or crop (or region of interest) defined during the operation of the device. It may be desirable in some embodiments that this is more flexible and/or also more power efficient.

Figure 1:
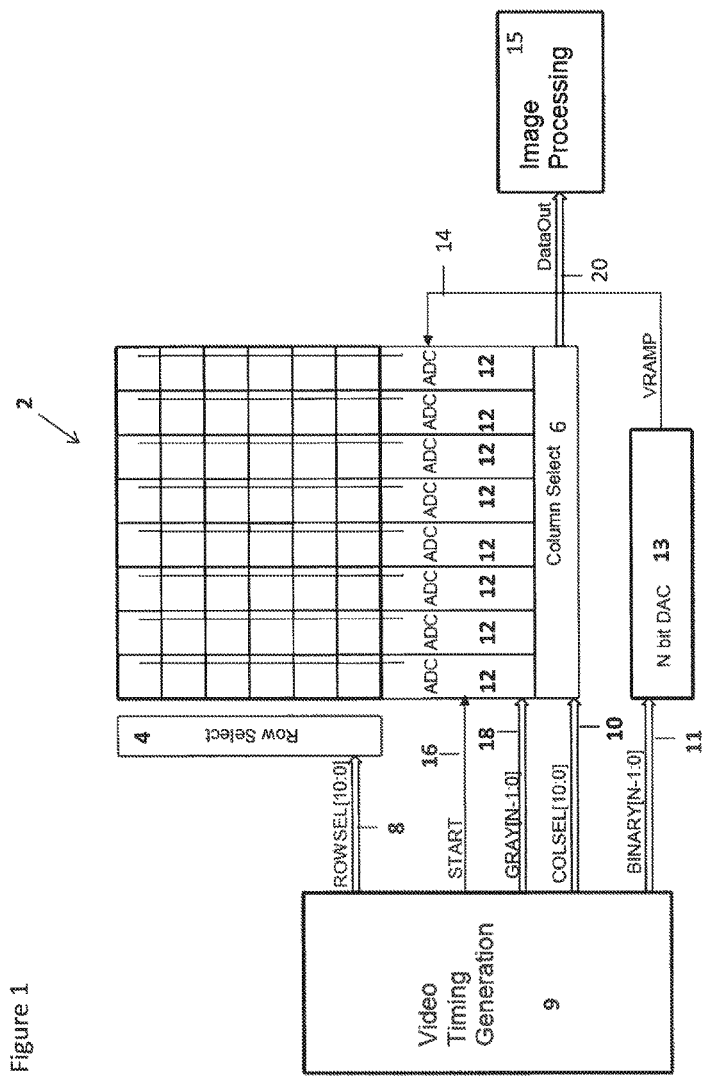
FIG. 1 shows an image sensor architecture.

Reference is made to FIG. 1 which shows an example of an image sensor architecture with which some embodiments may be used. FIG. 1 shows an array 2 of pixels arranged in Y rows and X columns. A row selector 4 is provided along with a column (select) decoder 6. The row selector 4 is controlled by a row select signal 8. The column decoder 6 is controlled by a column select signal 10. Read out circuitry 12 is associated with each column and is schematically referenced 12. That read out circuitry may comprise analog to digital conversion circuitry and sensing circuitry. Each read out circuitry 12 is configured to receive a voltage signal VRAMP 14, a start signal 16 and a count signal 18. In some embodiments, the count signal is in the form of a Gray code count signal. In other embodiments, the count signal may take a different form. The read out circuitry is configured to provide a data output signal 20. The data output signal may represent the data captured by the pixels.

A video timing generator 9 is provided which outputs the row select signal 8, the start signal 16, the count signal 18, the column signal 10 and a binary output signal 11. The binary output signal is input to an N bit DAC (digital to analog converter) 13 which outputs the voltage VRAMP. Thus the binary output signal 11 causes the DAC 13 to provide in some embodiments a linearly changing voltage signal VRAMP 14. The voltage signal VRAMP may linearly increase or linearly decrease.

The output data 20 is provided to an image processor 15.

It should be appreciated that the array may have any suitable number of rows and columns and the number of rows and columns shown is by way of example only.

Figure 2:
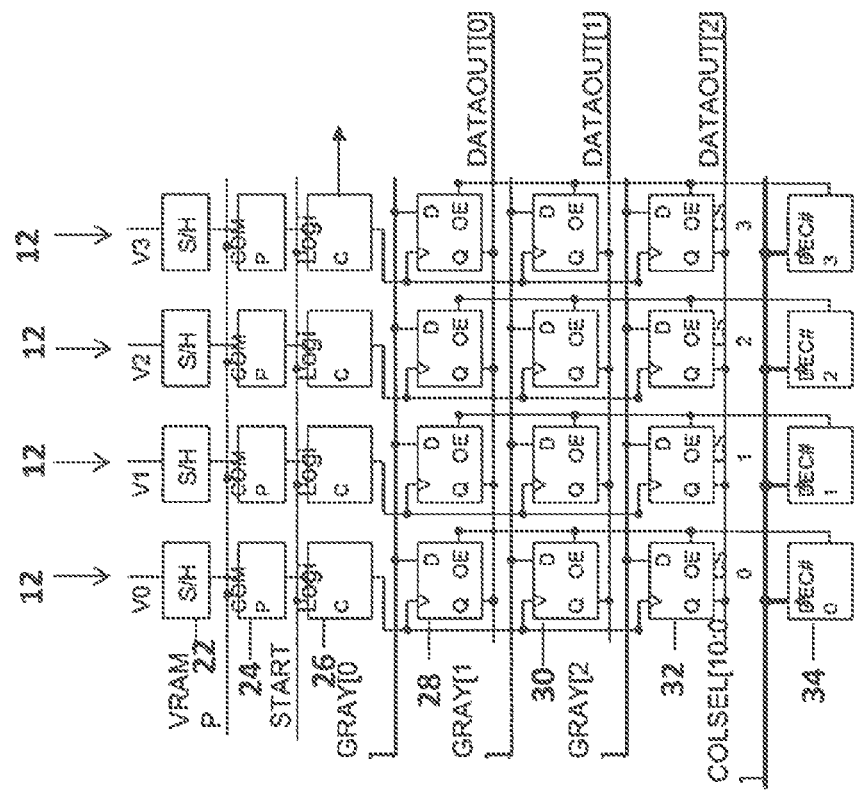
FIG. 2 shows in more detail an example of readout circuitry.

Reference is made to FIG. 2 which schematically shows one example of read out circuitry in more detail. In the arrangement of FIG. 2, the read out circuitry for columns 0, 1, 2 and 3 are shown. In practice, readout circuitry will be provided for each of the X columns.

Each set of readout circuitry 12 associated with a column comprises a sample and hold circuit 22. This circuit captures the voltage Vn on the respective column. This is effectively capturing the voltage output by the pixel in the row selected by the row select signal 8 of that column. The signal captured is provided to a comparator 24. The comparator 24 is configured to compare the voltage output by the sample and hold circuit 22 to the signal VRAMP. When the voltage signal from the sample and hold circuit exceeds the VRAMP voltage, the output of the comparator 24 will change state. Typically the comparator output would change from a low value to a high value. The output of the comparator is used as an input to a logic element 26. Each logic element 26 is controlled by the start signal 16.

The output of the comparator 24, provided via the logic element 26 is provided to ten SRAM (static random access memory) elements. In the example shown, only three of the ten SRAM elements 28, 30 and 32 are shown. It should be appreciated that in other embodiments, different numbers of SRAM elements may be provided. The output of the comparator is provided to a clock input of each of the SRAM elements 28, 30 and 32. The SRAM elements are enabled by the output of the column decoder 34, when that column is to be read out. Each SRAM element receives one bit of a Gray code count. The Gray code count value is a measure of the value of VRAMP being used by the comparator. As VRAMP increase, the Gray count value increases. When the pixel voltage is greater than VRAMP, the SRAM elements are controlled via the clock input to capture the value of the Gray code count, thus capturing a value represent the value of the pixel voltage. Each SRAM as an output which provides the captured Gray code value as an output.

The logic element 26 may be any suitable logic element. There is often noise on the signals, which may make the comparator fire more than once. In some embodiments, the logic element may be a flip-flop so that only the first crossing is used. It is sometimes desirable to force the latches or SRAM elements to store a value, even if the pixel output voltage (Vn) is outside the range of the ramp. The logic element may provide this function. The logic element may alternatively or additionally be used in a test mode to ensure that the latches store the data on the "GRAY" bus at an appropriate time. This logic element may be used to write a predetermined value into the latches/SRAM and later read out as part of a RAM test mode.

The arrangement of FIG. 2 is such that each row is read out one at a time. The arrangement of FIG. 2 can be used so that all the pixels of the imaging array are read out. However, in some situations, not all the pixels need to be readout. The arrangement of FIG. 2 may have reduced power consumption if there is a reduction in the vertical field of view. For example if some rows do not need to be read out it is possible to save power by turning off the readout circuitry when the rows are not read out. However, if there is a reduction in the horizontal field of view, where some columns of pixels are not readout, the arrangement of FIG. 2 does not have a mechanism to save power if not all the columns are read out. For example the power consumption for the reduced horizontal field of view may be substantially similar to a full readout with the arrangement of FIG. 2. This is because all the rows are read out and all the columns are enabled (even if their data is not read out). This is because the sample and hold circuit, the comparator and the logic element are on even if the column is not being read out.

Some embodiments may provide readout circuitry which may save power when some parts of the array are not being read. Some embodiments may provide arbitrary enabling of readout columns. This may reduce power consumption. This may also provide more flexibility in the resolution of the read out image.

In some embodiments, the analog to digital conversion part (e.g. the comparator and/or the sample and hold circuit) of the readout circuitry which may consume most power is disabled when the column is not being read out.

In some embodiments, the column address selection logic used for the readout is also used to control if the column is to be powered on or powered down. The columns may be operating (analog/digital conversion) all at the same time, but the addressing is done sequentially to the columns. Hence, in some embodiments, the enable signals may need to be stored.

Some consumer cameras may operate at pre-defined resolutions and may read-out the image data as fast as possible, e.g. to minimize the lag (sensor-display) in viewfinder mode, and/or reduce the time to acquire an image (still image mode).

Machine vision systems, which may be portable and/or battery powered may be different. For example, a system may observe the full field of view at low spatial and low temporal resolution for example, to see if there has been any (or small) change in the scene, e.g. an object appeared or disappeared in the field of view, or a particular color has appeared (e.g. a red LED turning on/off). Once this has been detected, then the system may switch to a higher spatial or temporal resolution mode to observe this object in greater detail. Even in a higher resolution mode, it may not be necessary to observe the full field of view, for example only the top left quadrant of the image may be observed and the other three quadrants of the image scene not observed. Of course there are many other possible scenarios.

Figure 3:
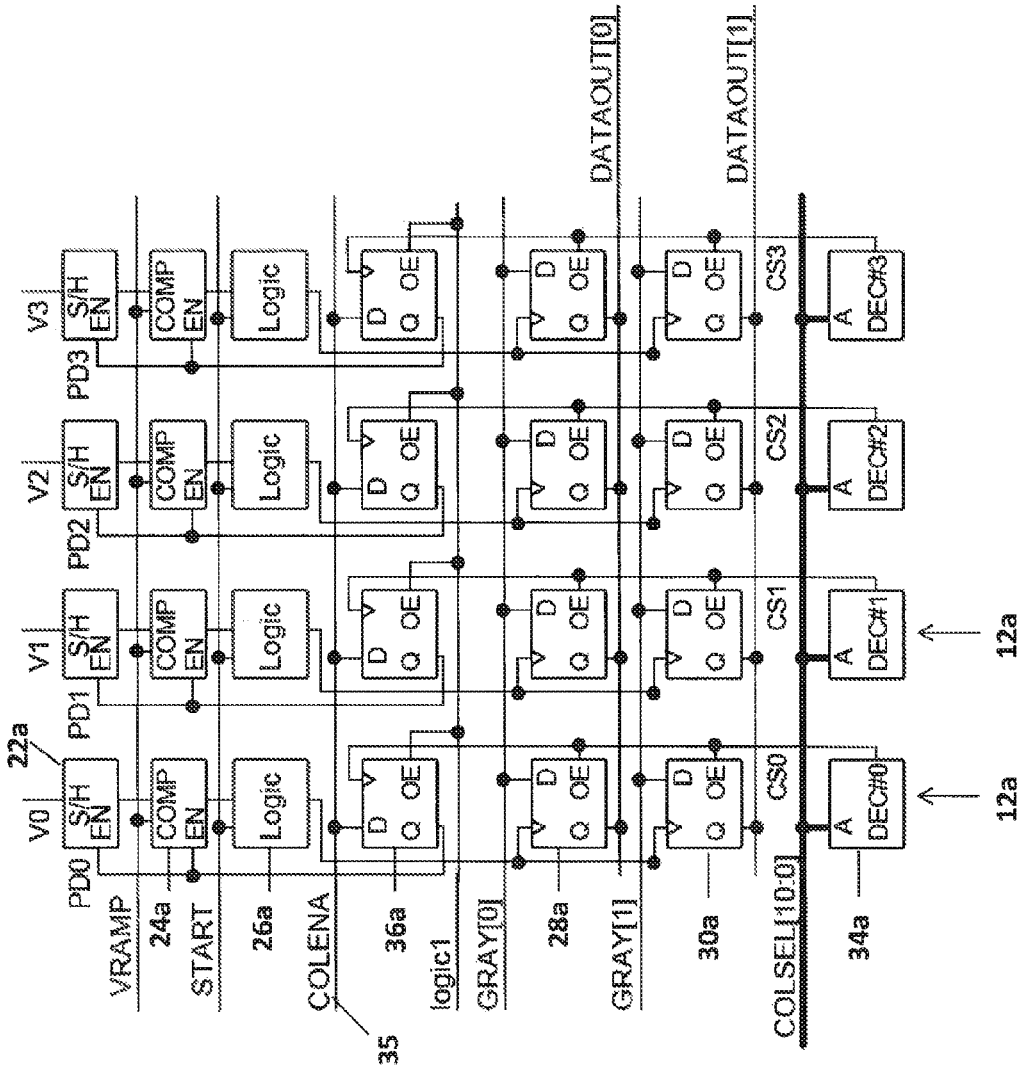
FIG. 3 shows a first embodiment of readout circuitry

Reference is made to FIG. 3 which shows an example of readout circuitry according to an embodiment. Those elements which are the same or similar to the elements of FIG. 2 are referenced with the same reference number followed by the suffix a. The differences between the arrangement of FIGS. 2 and 3 will now be described. It should be appreciated that in FIG. 3 only two of the SRAM elements 28a and 30a are shown but in practice all ten of the SRAM elements will be provided—or any other suitable number of SRAM elements.

An additional element 36a is provided in each readout circuitry. The additional element 36a is a column power controller. The column power controller may be an SRAM element or any other suitable latching element. The column power controller is configured to receive a column enable signal 35 as a data input. The column enable signal is based on the column select signal or may be provided by an additional signal. In practice the column enable may be a bus signal which is able to individually enable the column power controllers of each column. The column enable signal may be provided by the video timing generator.

The data output of the column power controller 36a is provided as an enable input to the sample and hold circuit 22a and the comparator 24a. The clock input for the column power controller is provided by the output of the column decoder 34a. The enable input of the column power controller is held at logic 1 value and thus is enabled.

Thus if a particular column is to be activated, the sample and hold circuit will be enabled via the enable input provided by the column power controller. Likewise the comparator 24a will also be enabled by the enable input provided by the column power controller. Thus the sample and hold circuit 22a and the comparator 22a will only be on if that column is to be read out.

Figure 4:
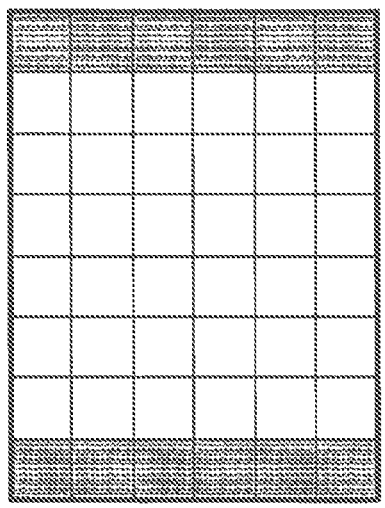
FIG. 4 shows an example of a reduced horizontal field of view.

The arrangement of FIG. 3 may be used for example with a reduced horizontal field of view as shown in FIG. 4. The white squares represent pixels that are read out and the shaded/hatched squares represent pixels that are not read out. With the arrangement of FIG. 3, the columns which are not required are effectively disabled and power consumption is reduced.

In some embodiments, the analog to digital conversion part (e.g. the comparator and the sample and hold circuit) of the readout circuitry which may consume most power is disabled when the column is not being read out. With the arrangement of FIG. 3, individual control of each column may be provided.

Figure 5:
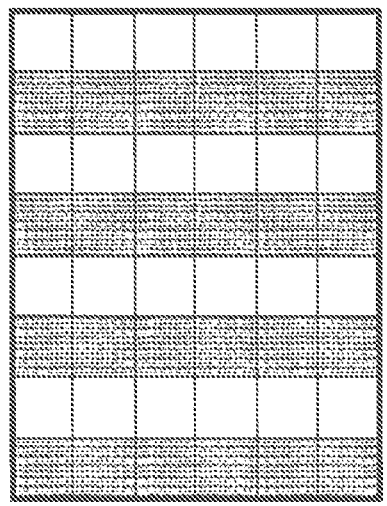
FIG. 5 shows an example where there are alternative columns to be read out.

FIG. 5 shows another example of pattern selection which can be supported by the arrangement of FIG. 3. In this arrangement, the alternate columns are switched off in a frame.

Figure 9:
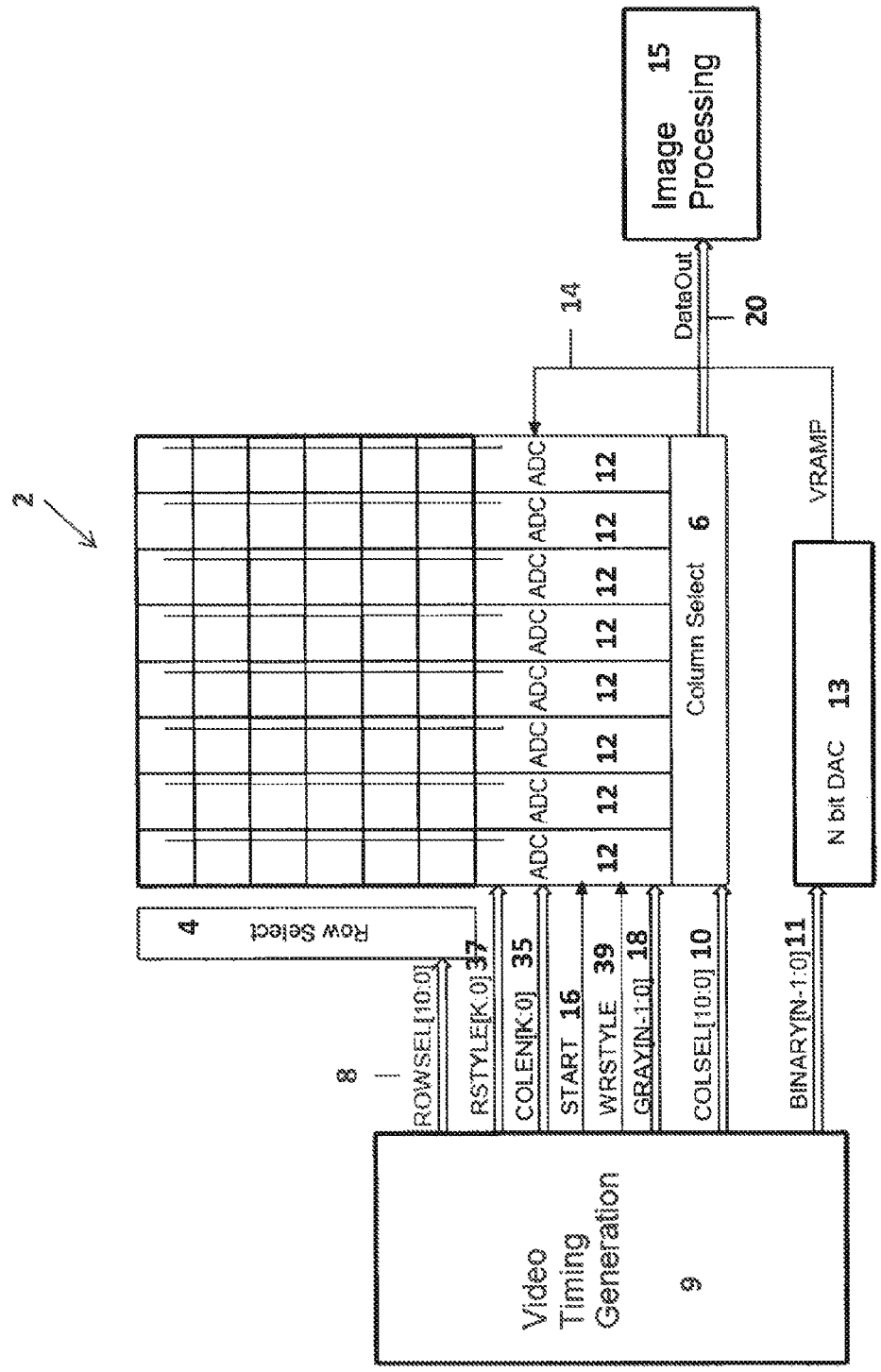
FIG. 9 shows another image sensor architecture.

Reference is made to FIG. 9 which shows another image sensor architecture. Those parts which are the same as in FIG. 1 are referenced by the same reference number. The video timing generator 9 is configured to provide a first signal RSTYLE 37 which has individual control signals for each column and a second signal WRSTYLE 39. These signals will be described in more detail later. Also shown in FIG. 9 is the column enable signal 35.

Figure 6:
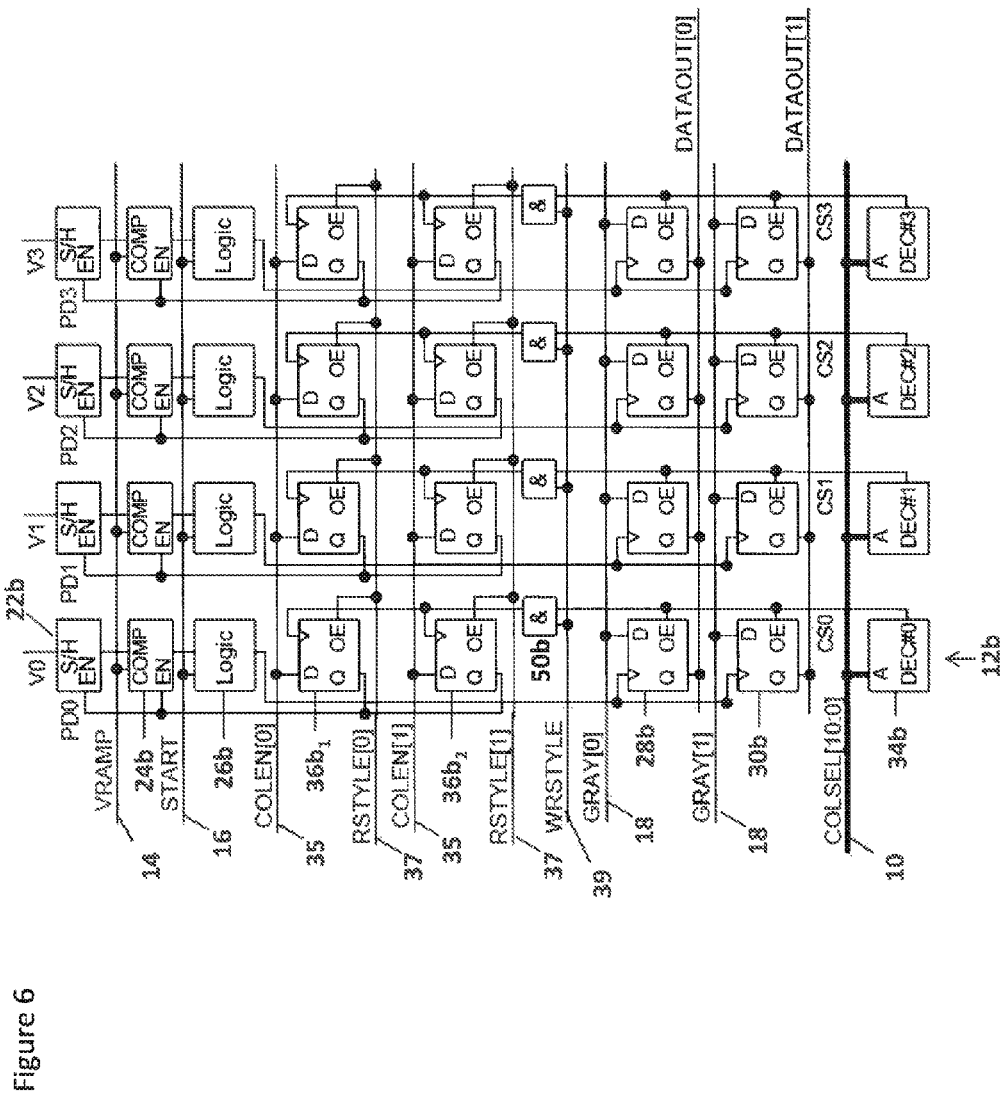
FIG. 6 shows a second embodiment of readout circuitry.

FIG. 6 shows an embodiment which is configured to support an arrangement having two different row types per column. This may be used in the architecture of FIG. 9. Those elements which are the same as in FIG. 3 (and/or FIG. 2) are referenced with the same reference number and the suffix b. In the arrangement of FIG. 6, two column power controllers $36b_1$ and $36b_2$ are provided. The first column power controller $36b_1$ has the data input configured to receive a column enable signal. The clock signal is provided by the output of the decoder 12b. The output of the first power controller $36b_1$ is input to the sample and hold circuitry 22b. The second power controller $36b_2$ is similarly configured but receives its own column enable signal.

The first column power controller $36b_1$ is configured to receive as an enable signal a first row style signal RSTYLE whilst the second column power controller $36b_2$ is configured to receive a second row style signal RSTYLE. The first row style signal will control which ones of the row elements are to be read out in first pattern, i.e. a first row style option. The second row style will provide a different row style option.

An AND gate 50b or similar logic is provided for each column which is configured to receive the signal WRSTYLE and the output of the column decoder. When both of these signals are high the output of the AND gate will provide the clock input to the column power controllers. It should be appreciated that only one of power controllers is in use at a time, depending on whether the first or second row style is active.

The signal WRSTYLE is used to control the writing of the row style. In the arrangement of FIG. 6, as the clock for the first and second power controllers comes from the column decoder, the respective power controller (which may be a latch) stored contents will be written to. The video timing generator will output the row style RSTYLE every time a row of data is to be read out. By gating the output of the column decoder with the WRSTYLE signal, the power controllers may only be written to when (a) addressed and (b) required.

Figure 7:
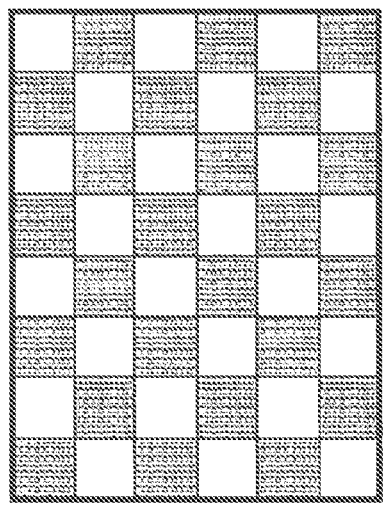
FIG. 7 shows an example of a half resolution read out with two different row types.

For example, reference is made to FIG. 7 which shows an arrangement where alternate pixels are read out in each row. A next row also has alternate pixels read out but offset with respect to the previous row by one pixel. The first row style would provide readout of for example the first, third and fifth pixels of a row whilst the second row style with provide readout of the second, fourth and six pixels of a row. Thus, one of the row styles will be enabled at a time. When a row style is enabled, selected ones of the pixels in a row will be read out. The row styles can be alternated or selected in any suitable order.

It should be appreciated that the arrangement shown in FIG. 7 is one example of an arrangement with two different row types. However, it should be appreciated that embodiment of FIG. 6 may be used with any two suitable row types.

Figure 8:
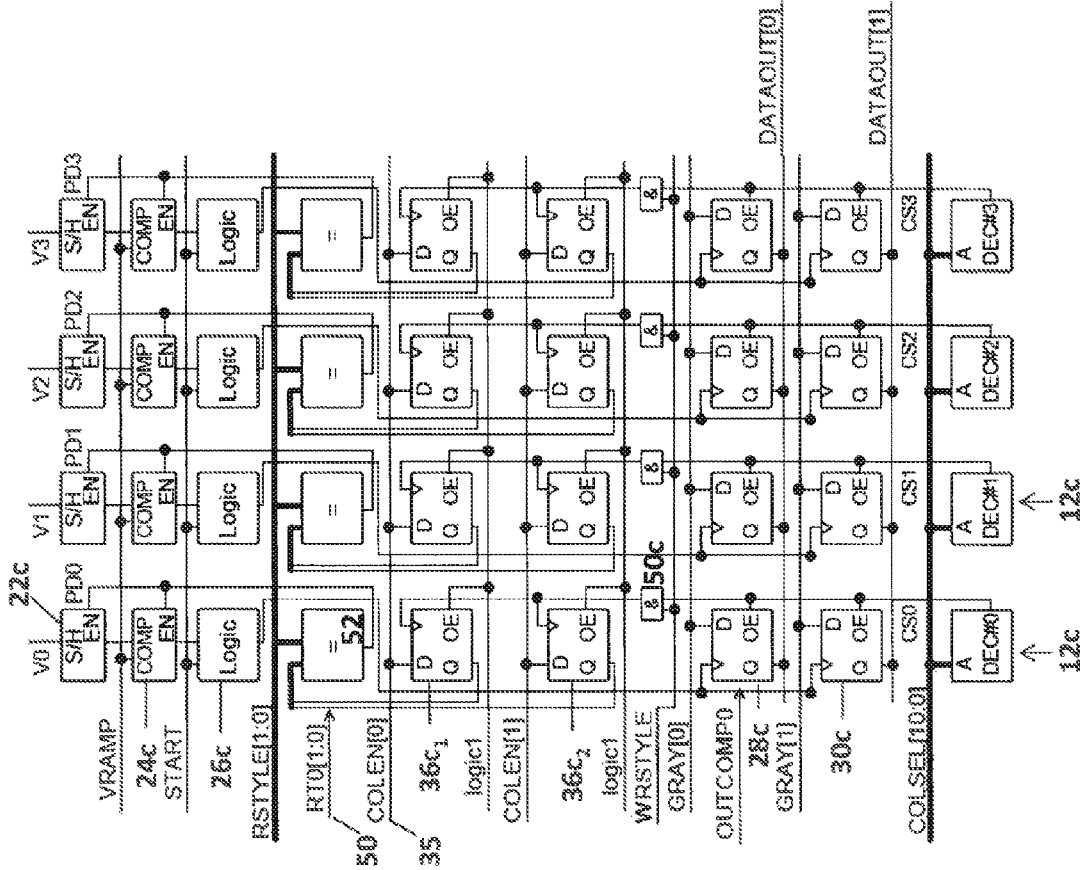
FIG. 8 shows a third embodiment of readout circuitry.

In FIG. 8, those elements which are the same as in FIG. 6 are referenced with the same reference number and with the suffix c. However the arrangement of FIG. 8 may support four different row types. As compared to the arrangement of FIG. 6, an equality block 52 is provided. The data output of each of the column power controllers $36c_1$ and $36c_2$ is input to the equality block 52. The enable input of the power controllers is tied to logic 1. The equality block 52 compares two input busses (RT (row type) and the output data bus from the column power controllers). When the two match, the output of the equality block 52 is valid and the comparator and the sample and hold circuit will be enabled. The signal RT is the row type number. With two power controllers, there are four possible types of rows with different enable patterns for each row. By setting RT, a particular row type signal is set. RT [1:0] may be a two bit bus giving four options. RT [0] is the least significant bit.

The signal OUTCOMP0 is from the respective comparator of the column and is shown for clarity. It is present in previous embodiments but not shown.

The selection of columns which are to be used may be constant in a frame. This enables the selection of which column is to be enabled or which is to be disabled to remain constant over the frame.

More complex sampling patterns may be supported by some embodiments. Examples of more complex patterns are shown in FIGS. 11, 12 and 13.

Figure 11:
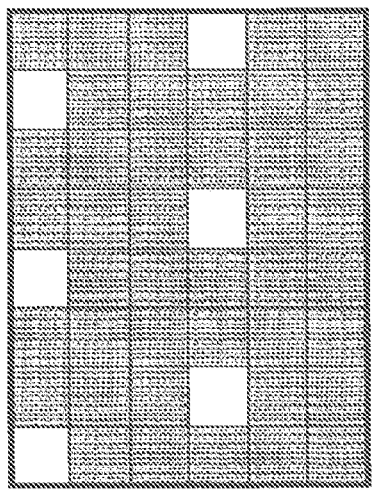
FIG. 11 shows an example with a low resolution checkerboard readout.

In FIG. 11, there are two row types. Some rows have no pixels read out (rows 2, 3, and 6) in the example shown—this can be achieved by disabling all of the column select signals. A first row type has every third pixel read out starting with the first pixel. A second row type has every third pixel starting with the second pixel.

Figure 12:
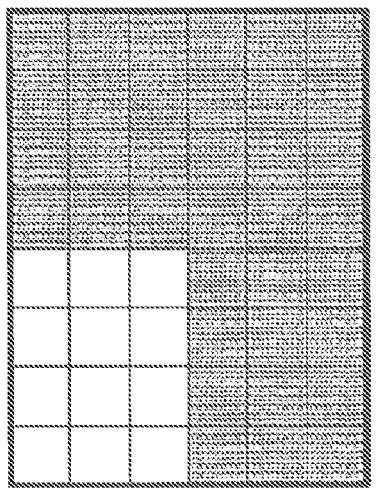
FIG. 12 shows an example with top left readout only.

FIG. 12 shows an arrangement where there is one row type and the top left part of the array only is read out. The first row type reads out the first half of the row and not the second half of the row (for example rows 1, 2 and 3). Some rows have no pixels read out (for example rows 4, 5 and 6).

Figure 13:
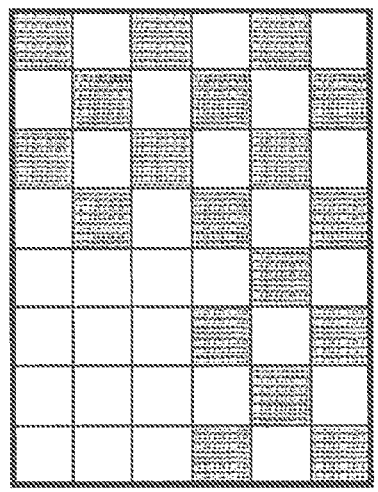
FIG. 13 shows an example with top left high resolution and medium resolution elsewhere.

FIG. 13 shows an example with top left high resolution and medium resolution elsewhere. This example has all the pixels in the top left area of the array read out and every other pixel read out elsewhere with adjacent rows being offset with respect to one another. This would require four row types, two for the top four lines and two types for the bottom four lines.

These patterns may be static for several/many frames, or they can change on a frame-by frame basis. For example the pattern shown in FIG. 13 has the top-left part of the image as high resolution and lower resolution elsewhere, but the section of the image that is high resolution can be moved across the image plane on a frame-by-frame basis, for example allowing a moving object to be tracked with higher resolution and the background with lower resolution.

Reference is made to FIG. 10 which shows a timing diagram for a system such as shown in FIG. 8. There are two basic phases:

(a) Configuration of which columns are to be enabled/disabled;

(b) Readout of the array, whereby only some of the array's ADC/columns may enabled, depending on a particular row.

By way of example only, consider the pattern shown in FIG. 7 where on odd numbered rows, odd numbered pixels are disabled and even numbered pixels are enabled. By way of example only, this is row style number 3. Similarly, on even numbered rows, even numbered pixels are disabled and odd numbered pixels are enabled. This is row style number 1. The following will refer to these row style numbers but it should be appreciated that this is by way of example only.

The first phase (a) occurs when the WRSTYLE signal 39 goes high. This signal is input to the AND logic or appropriate gating logic, so that when the column select bus 10 selects a column, the write data to the column power controller is enabled. The first value on the column select bus COLSEL bus is "0" and so the column select line CS0 from the decoder goes valid, enabling the SRAM elements. The column select line (CS) may be providing two functions: enabling the OUTPUT of the SRAM elements; and enabling/storing the data from the RT bus.

It has been determined that the column number 0 should be enabled on row type number 3, hence the controller (external to the array) will drive the COLEN bus with the value 3. This value "3" is then stored in the power control blocks for column number 0 and is shown by RT0[1:0] now storing 3 in the column power controller 36c1 and 36c2 of FIG. 8.

The second value on the column select bus COLSEL bus is "1" and so the column select line CS1 from the decoder of column 1 goes valid, enabling the SRAM elements. The signal WRSTYLE is still high.

It has been determined that column number 1 should be enabled on row type number 1, hence the controller (external to the array) will drive the COLEN bus with the value 1. This value "1" is then stored in the power control blocks for column number 1 and is shown by RT1[1:0] now storing "1" in the power controllers in column 1

This process is repeated for all/most of the columns in the array, the signal WRSTYLE being high whilst this is carried out. The signal WRSTYLE will then go low for phase (b)

Once this phase (a) has been performed, phase (b), that is readout of the array will be performed. Only two rows (lines) are shown.

For row "y" (an odd numbered row in this example), row select "RSy" goes valid, which in some embodiments may be high and all other row select lines are low. Other embodiments may have a low valid signal. The pixels in the row will output a voltage on the bit lines V0-VN. It has been determined that for row "y", only the columns of even number are required. In this particularly arrangement, this is row style number 3 and is signaled by setting the RSTYLE [1:0] bus to 3.

In some systems, there will be a signal to indicate that the ADC is to start. This is shown by the START signal pulsing. In the case of a single-slope ADC, the GRAY bus will increase and the VRAMP voltage will start to linearly change. In this embodiment the voltage ramps low to high but in other embodiments the voltage may ramp from high to low. As the value on the RSTYLE[1:0] bus (3) matches the value stored in the power control blocks of column number 0, then the equality logic of equality block 52 will be valid and so the enable signal PD0 will be high (causing the sample and hold circuit 22c, the comparator 24c and/or other ADC circuitry to be enabled).

However, as the power controller blocks of column 1, contain the value "1" and this does not match the value on the RTSTYLE [1:0] bus, the output from the equality logic of the equality block will be invalid, so the enable signal for the first column PD1 will be low, causing the sample and hold circuit 22c, the comparator 24c and/or other ADC circuitry in column number 1 to be disabled.

Similarly, columns 2, 4 and the other even numbered columns will have the value 3 stored in their column power controller blocks and so match the values on RTSTYLE bus causing the sample and hold circuit 22c, the comparator 24c and/or other ADC circuitry to be enabled. Columns 3, 5, 7 and the other odd numbered columns will have 1 stored in their power controller blocks and so will not match the values on RTSTYLE bus and their sample and hold circuit, comparator and/or other ADC circuitry will be disabled to save power.

Hence, the even numbered pixels have been output and converted into a digital value and are ready to be read out. They could be readout before the next row is converted—this requires fewer memory cells in the column, but is not as fast. In some embodiments, there are more memory cells in a column (e.g. for a N bit convertor, 2*N bits per column), which allows one row to be analog to digitally converted while the previous row is read out.

For the next row, (y+1) (an even numbered row in this example), the RSy goes low (inactive) and RSy+1 goes high (active). Also, the RSTYLE bus now gets set to "1". This matches the data in the power controller block in only the odd numbered columns and only the odd-numbered columns are enabled.

In FIG. 10, the COLSEL signal counts through even numbers. This is because the data from the previous row ("y") is being read out from the columns and only the even numbered columns have been enabled and so only the even numbered columns contain valid data.

FIG. 14 shows various modes which can be supported by some readout circuitry of some embodiments. Is should be appreciated that some embodiments may support only one mode whilst other embodiments may support more than one mode.

Mode 1: In this mode, Row N is enabled, Row N has ADC performed and Row N is readout. This is repeated for each next row.

Mode 2: In this mode Row N is enabled while Row N-1 is read out, and Row N has ADC performed. This is repeated.

Mode 3. In this mode Row N is enabled and Row N has ADC performed. Row N-1 is read out while Row N is being enabled and while Row N has ADC performed.

Mode 4: Enable row N, enable/disable columns, perform ADC on Row N and readout row N. This is repeated for the next row.

Mode 5: Enable Row N, perform ADC on Row N, readout Row N while enabling and disabling columns. This is repeated for the next row.

Mode 6: Define enable/disable column style 0, followed by defining the next enable/disable column style until all of the enable/disable column styles have been performed. This is followed by enable row N, when row style is equal to 3, in this example. This is followed by performing ADC for Row N. At the same time as row N is being enabled and ADC is being performed, Row N-1 is read out. This is repeated for the next row with the appropriate row style.

The definition of the enabling/disabling columns may be done at any suitable times. Some embodiments may be able to support the definition of the enabling/disabling columns at one or more of: (a) the start of every frame, (b) only when the pattern changes, (c) on initialization of the sensor (d) at various/regular intervals in case the data in one of the power control blocks is corrupted The enabling and disabling of columns can be performed on a row-by row basis. This may vary between rows. This may be achieved by re-writing the column enable data on each line. This could be done as a separate operation to the readout, or during the readout. I.e. when reading out row N, the column selection for row N+1 may be written at the same time depending on the readout circuitry.

For y=1 to MaxY
For x=1 to MaxX
DataOut←pixel (x,y); column _enable(x,y+1) (This is COLENA)→Column_Enable
Next x
Next y This technique requires the least amount of logic and memory, but requires that the unused pixels (columns) of row "y" be read out so that the columns for the next line ("y+1") can be written. As all the pixels are read out (including those whose columns have been disabled), it may be necessary to remove the data from those pixels whose columns have been disabled from the output image. This may be achieved in various ways. For example, the column's enable signal may be used to control the SRAM latch output enable, as shown previously. If the column is not enabled, then the output enable is inhibited. This means that the DataOut bus is not driven. Hence the stray/parasitic capacitance on the DataOut bus will cause it to retain the data from the pixels that have the enabled columns. This technique can in some situations be susceptible to noise from various sources on the chip, so in some embodiments, digital logic may be used to decimate the data. This may be carried out the video timing generator or the image processor.

Some alternative embodiments may use a column enabling technique that does not re-use the address and decode circuitry, but uses a separate set of memory for each column. This memory is typically initialized at the start of a frame or less frequently if the pattern of pixels to sample changes less frequently.

Reducing power in each column is useful, but when power saving is required, then it is may be desirable that as much power is saved as practical. In some situations a power-consuming section of the circuitry is the analog-digital convertor. In some embodiments, a column-parallel, single-slope ADC system is provided on a CMOS image sensor. There is a single DAC comparator in each column and SRAM to store when the output of the comparator changes. Reducing the power consumption of the DAC may be advantageous. In some embodiments, the load on the DAC for columns which are not to be used may be reduced so the power consumed by the DAC can be further reduced.

There are various types of comparator architectures used and some embodiments may provide a power saving benefit.

Figure 16:
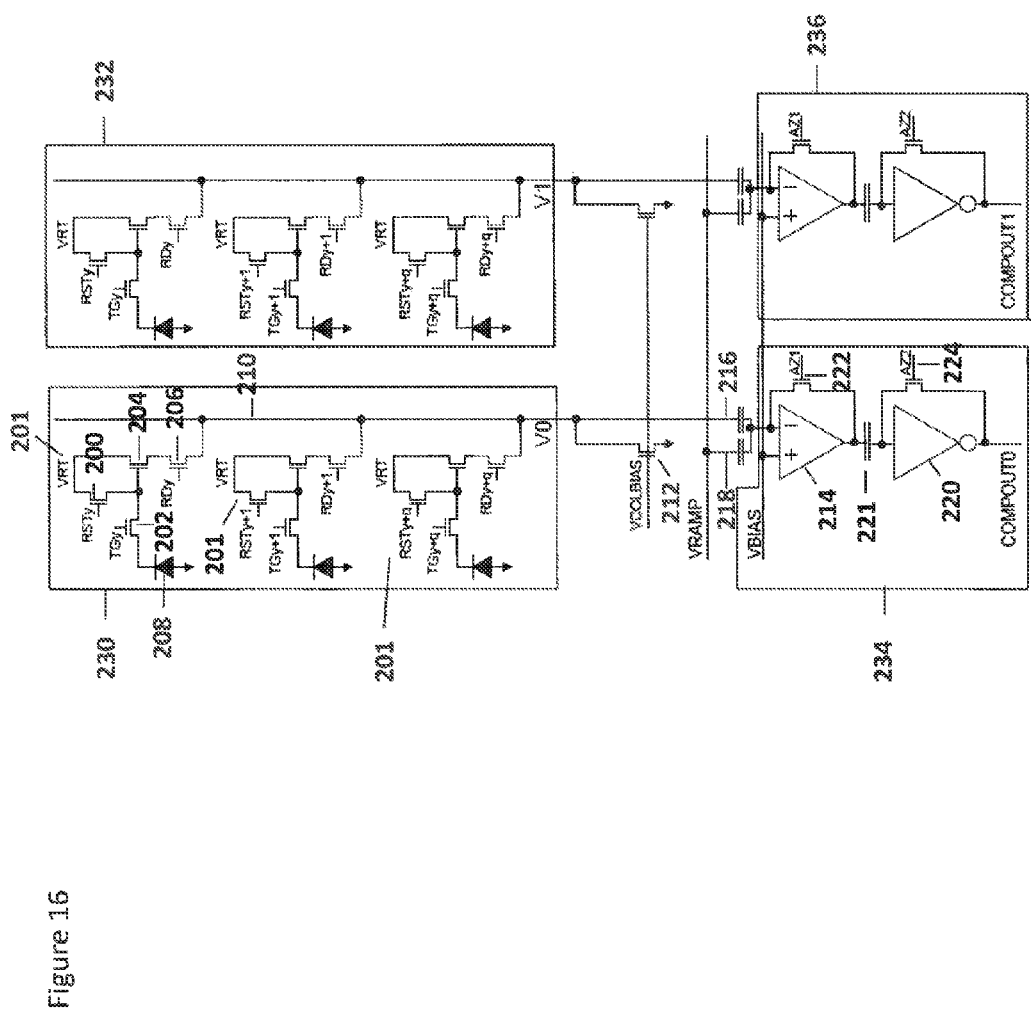
FIG. 16 shows a first arrangement of part of a pixel column and associated comparator circuitry, for two columns.

Reference is made to FIG. 16 which shows a first CTA (continuous time architecture) architecture. The arrangement of FIG. 16 schematically shows two columns of pixels 230 and 232. In the example shown, the pixels are each connected to a readout line 210 which provides the voltage of the pixel of the row being read. The pixels are 4T (four transistor) pixels 201. Each pixel comprises a photodiode 202, a transfer gate transistor 204, a source follower transistor 202, a reset transistor 200 and a read transistor 206. These transistors act to reset, expose and then read out data from the photodiode. The transfer gate transistor 202 is controlled by a signal TG, the reset transistor 200 is controlled by a signal RST and the readout transistor 206 is controlled by the read signal RD to provide a signal to the readout line. The source follower transistor 204 has its gate tied to a sense node. In this example, the pixel has a 4T structure. However it should be appreciated that in other embodiments, the pixel may have any other suitable structure.

Each column is provided with respective comparator circuitry 234 and 236. The comparator circuitry comprises a differential comparator 214. The comparator 214 receives a bias voltage VBIAS as a first input and a second input which will be discussed in more detail later. A feedback path is provided from the output of the comparator to the second input of the comparator 214. A transistor 222 is provided in that path with a gate signal controlling whether that feedback path is open or closed. The output of the comparator is provided via a capacitor 221 to an inverter 220. The output of the inverter provides the comparator output. The output of the comparator is used as previously discussed. A feedback path is provided between the output of the inverter and its input. Again, a transistor 224 is provided in that path. That transistor receives a gate signal which controls whether or not that path is open or closed.

The output of the pixel being read is provided to a first capacitor 216. The voltage VRAMP is provided to a second capacitor 218. A node between the two capacitors 218 and 216 provides the second input to the comparator 214. A transistor 212 is provided which has its source connected to the read out voltage of the pixel and a column bias voltage is applied to the gate of that transistor.

Figure 17:
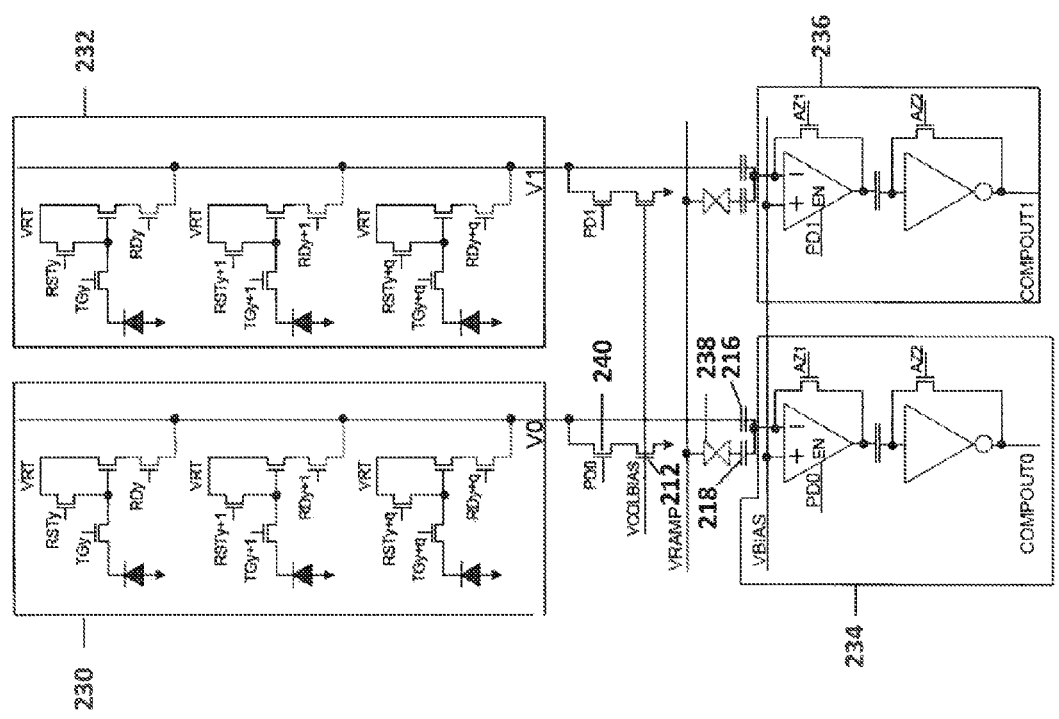
FIG. 17 shows a second arrangement of part of a pixel column and associated comparator circuitry, for two columns.

Reference is made to FIG. 17 which shows a modification of the arrangement shown in FIG. 16. It should be appreciated that the pixel array 230 and 232 is as shown in FIG. 16. Likewise the comparator circuitry 234 and 236 are as shown in FIG. 16 but with the enable/disable signal (or power down signal) PD being used to control if the comparator is enabled or disabled. The PD signal is used to power down the differential input comparator when that comparator is not required.

In some embodiments, a transmission gate 238 is provided between the VRAMP voltage and the capacitor 218. A transistor 240 is provided in series between the transistor 212 and the output of the pixel array. The gate input of this transistor is provided by the enable signal PD.

The transmission gate 238 provides a switch function to disconnect VRAMP from the comparator. The additional transistor 240 provides a switch means to turn off the bias current. In other words, the bit line bias current provided by transistor 212 is prevented from being applied to the read line 210.

It should be appreciated that in the example shown, the transistors are N type transistors. However, this is by way of example only and in different embodiments the transistors may be different types of transistor.

A switch may be thus be inserted between the output of the DAC and the coupling capacitor to the comparator (e.g. transistor 240). By opening the switch when the column (comparator) is powered-down/unused, the loading of the DAC is reduced. This switching of the comparator input saves power consumption, but as the load of the DAC is reduced, it is possible to re-design the DAC for further power savings by adjusting the current it consumes depending on the load.

From the well-known equation:

$$I = C \times dV/dt \qquad \text{(Equation 1)}$$

This equation relates current, capacitance, voltage (change) and (change) in time If the DAC is operating at the same speed (as without an embodiment) and similar voltage swing (as without an embodiment), but the capacitance that it has to drive is lower, then the current required will be proportionally lower.

As shown in Equation 1, the current required to drive a capacitance is reduced if the capacitance is reduced, but also reduced if the time is increased (i.e. slew-rate reduced). If the frame rate is reduced, it is possible to reduce the slew-rate of the ramp and save current. For example, if the load on the DAC is 10 pF and the sensor has 1000 lines (rows) and is readout at 100 Hz, there is 1/(100×1000)=10 µs per row. Typically, not all this time is available to ramp the DAC signal "VRAMP", for illustration, it is assumed there is only half this, 5 µs to ramp. Hence, the current required to drive the VRAMP signal=10 pF×1V/5 µs=2 µA. In situations where not every row is read out (e.g. only half the number of lines), but the frame rate is the same, the line time can be increased, hence the slew-rate reduced and current consumption also reduced. In the above example, the current to drive the VRAMP signal is now 10 pF×1V/10 µs=1 µA.

Figure 18A:
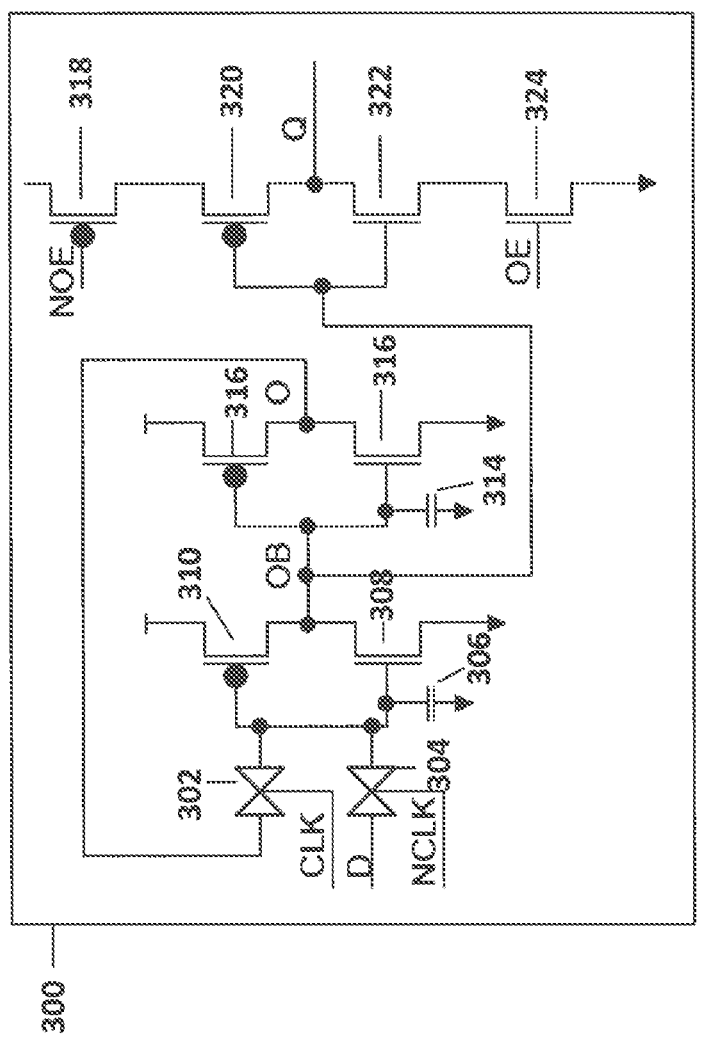
FIG. 18A shows a typical latch usable in readout circuitry.

A typical SRAM latch circuit 300 is shown in FIG. 18A. Each latch has a first transmission gate 302 and a second transmission gate 304. The first transmission gate 302 is configured to be controlled by the clock signal CLK and receive as an input the output O from a node between a p type transistor 315 and a n transistor 316 arranged in series. The second transmission gate 304 is configured to receive the inverse of the clock signal NCLK as a control signal and data D as an input. The output of each transmission gates is provided to the gate of a p type transistor 310 arranged in series with an n type transistor 308. The transistor 308 is also configured to receive the output of each of the transmission gates as a gate input. A capacitance 306 is coupled to the gate of the transistor 308.

An output node is provided between the two transistors 310 and 308 which is referenced OB. That output node OB is coupled to the gates of transistors 316 and 315, arranged in series. A capacitance is coupled to the gate of the transistor 316. The output OB is also provided to the gates of a further pair of transistors arranged in series. The first transistor of the further pair is transistor 320 which is a p type transistor whilst the second transistor 322 is an n type transistor. An output Q is provided from a node between the transistors 320 and 322. A further transistor 318 is arranged in series with transistor 320. That transistor 318 is a p type transistor and receives the input NOE, not OE. The transistor 322 is arranged in series with a further n type transistor 324 which receives the control signal OE at its gate.

When the clock is low, the inverted clock will be high. OB can be considered to be not the data D. O can be considered to be the data D. As D is connected to the Gray bus, which is counting, then O and OB are also counting and power will be consumed by stray capacitances. Capacitors 306 and 314 may be considered to be stray capacitances.

Figure 18B:
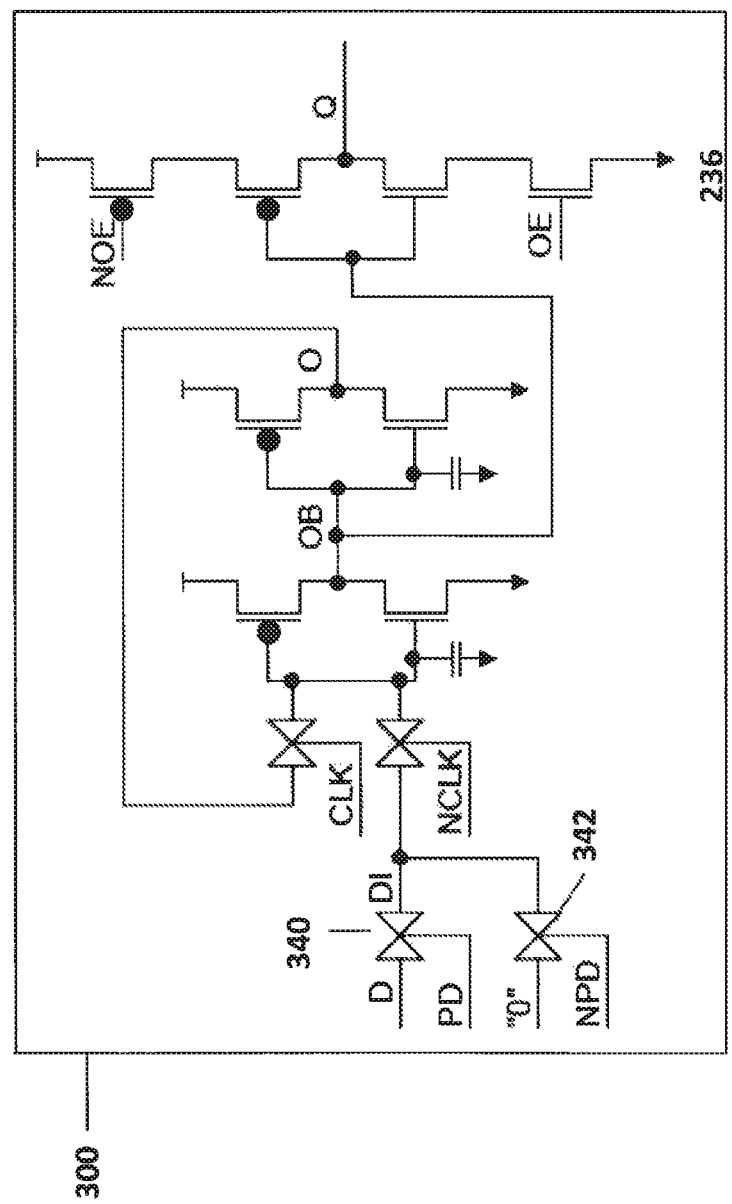
FIG. 18B shows a modified latch usable in readout circuitry.

Reference is made to FIG. 18B which shows a modification to the arrangement of FIG. 18A. The SRAM latch 300 is as shown in FIG. 18b but additional circuitry is provided on the input. In particular, third and fourth transmission gates 340 and 342 are provided. The third transmission gate 340 is configured to have its input connected to the data input and is output coupled to the input of the second transmission gate 304. The third transmission gate 340 is controlled by the signal PD The fourth transmission gate 342 is controlled by the signal NPD which is the inverse of signal PD. A zero value is provided on the input of the fourth transmission gate 342. The output of the fourth transmission gate 342 is provided to the input of the second transmission gate 304.

When the column is enabled, the signal PD may be high and so the output of the third transmission gate is the same as the input to the second transmission gate. O will equal the data which will equal the output DI of the third transmission gate. Power may be consumed by stray capacitance as D is counting. However, when the column is not enabled, PD is low and so the output of the third transmission gate is low as is the output of the fourth transmission gate. This does not change and so no power is consumed, which might otherwise cause charging/discharging the stray capacitances.

By way of example only, if there are 1600 columns and the ADC resolution is 10 bits, then there will be 1600× 10=16,000 instances of these SRAMS. As the input data changes, then the gates at the input of the SRAM consume power. Further, the internal or output node of the SRAM changes as well, further increasing the power consumption. In some embodiments, as the column is not used, there is no need for the SRAM to function. Hence by disconnecting the SRAM input from the data bus, further power savings can be achieved. Preferably, the input is not left floating, rather it is connected to a fixed logic level (ground (0) or VDD (1)). In the example of FIG. 18b, the SRAM is tied to logic level 0.

Some embodiments may allow the arbitrary enabling of readout columns. This may reduce power consumption. Power consumption savings may be achieved in analog components and/or digital components.

Figure 15:
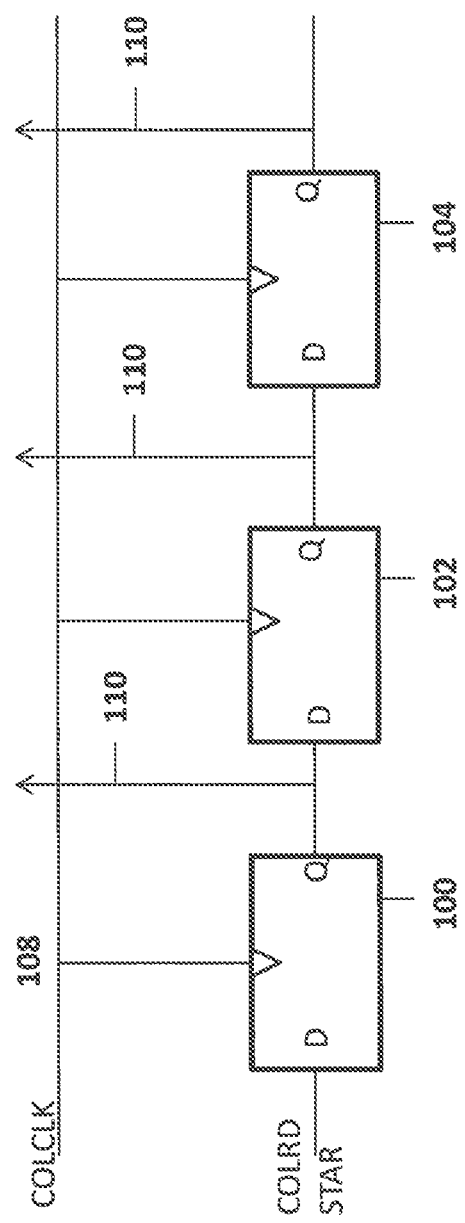
FIG. 15 schematically shows shift register control usable with readout circuitry.

Some sensors may use a shift register instead of an address bus with the column select. This type of column addressing may be used in some embodiments. Reference is made to FIG. 15 which shows circuitry that can be used instead of the column decoders shown in some embodiments. The arrangement shown in FIG. 15 provides shift register read out control.

A series of latches are provided, with one latch for each column. In the example shown in FIG. 15, only three latches 100, 102 and 104 are shown. However, it should be appreciated that a latch is provided for each column and so in practice more latches may be provided. The latches are arranged in series with the output of one latch being input to the data input of the next latch. The clock signal for each of the latches is provided by a column clock signal 108. The data input of the first of the latches 100 is provided by a column read out start signal COLRDSTRT. Typically, this will go high for one column clock pulse at the start of the readout. Thus, shift register addressing of the columns is provided. The data output of each latch, referenced 110 provides the same function as the output of the column decoder as described in previous embodiments.

Some embodiments have been described as having application to machine vision applications. Other embodiments may have application to any other suitable image capture. For example, some embodiments may be used with "pan and scan" where part of the image is cropped and then the cropped part of the image is moved across the array. This technique may be used with a camera such as a security camera so that instead of physically moving the camera, the crop part of the image is moved around.

Various of the examples shown have used SRAM elements. It should be appreciated that any other suitable memory element may alternatively or additionally used. For example any suitable latch may be used.

Some embodiments have described the use of single-slope ADCs. It should be appreciated that in other embodiments, different types of ADCs may be used. By way of example, sigma-delta ADCs, SAR (successive approximation) ADCs, pipelined ADCs, cyclic ADCs or any other suitable ADC may be used.

Figure 19:
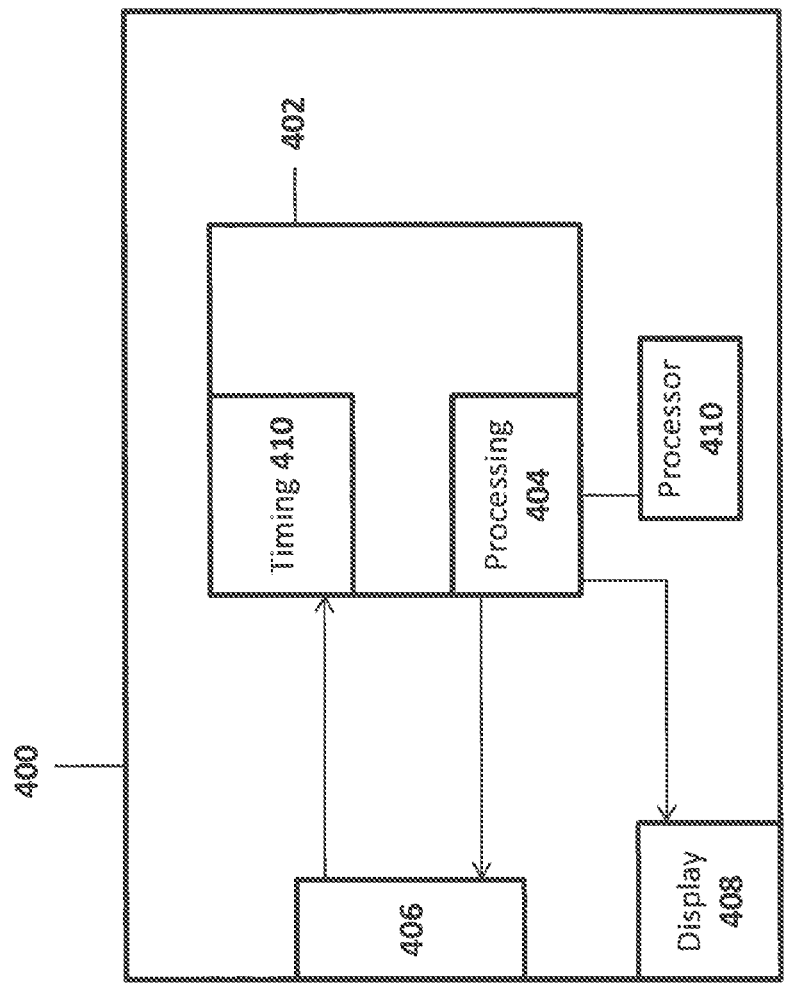
FIG. 19 shows a device in which some embodiments may be incorporated.

Some embodiments may be provided in a device 400 such as shown in FIG. 19. The device 400 may comprise any an image sensor arrangement 402 such as shown in FIG. 1 or 9. The video timing generation circuitry is referenced 410 and the image processing circuitry is referenced 404. An output from the image processing circuitry may optionally be provided to a display 408 and/or optionally to an interface 406 for output and/or optionally to a processor 410 for analysis. The video timing generator may optionally receive control information from an external source via the interface 406.

It should be appreciated that the device may be any suitable device. By way of example only and without limitation, that device may be a camera device. The camera device may be a machine vision device, a security camera or a consumer device. The consumer device may be any suitable device such as a mobile telephone, smart phone, tablet, standalone camera, computer or any other suitable device.

It should be appreciated that some or all of the image sensing arrangement of embodiments may be provided on a die, an integrated circuit, two or more dies, two or more integrated circuits, at least one die and at least one integrated circuit.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

What is claimed is:

1. A circuit for read out from an image array including a plurality of column lines, said circuit comprising, for each column line:
   an analog-to-digital conversion circuit having an input coupled to the column line, said analog-to-digital conversion circuit enabled for operation in response to a conversion enable signal;
   a control circuit configured to generate said conversion enable signal, the control circuit comprising:
      a first control circuit having a data input configured to receive a first column enable signal, an enable input configured to receive a first row style signal and a data output configured to generate a first output enable signal; and
      a second control circuit having a data input configured to receive a second column enable signal, an enable input configured to receive a second row style signal and a data output configured to generate a second output enable signal;
   wherein the conversion enable signal is derived from the first and second output enable signals; and
   wherein the first row style signal specifies a first pattern of column lines for read from the image array and wherein the second row style signal specifies a second pattern of column lines for read for read from the image array.

2. The circuit of claim 1, wherein the analog-to-digital conversion circuit comprises:
   a sample and hold circuit having an input coupled to the column line; and
   a comparator circuit having a first input coupled to an output of the sample and hold circuit and a second input coupled to receive a ramp signal;
   wherein the sample and hold circuit and comparator circuit are enabled for operation in response to said conversion enable signal.

3. The circuit of claim 1, wherein the first and second control circuits are flip-flop circuits.

4. The circuit of claim 1, further comprising:
a column decoder configured to generate a column selection signal for each column; and
a logic gate for each column configured to logically combine the column selection signal with a write style signal to generate a write control signal applied to control a write operation by the first and second control circuits to store the first and second column enable signals, respectively.

5. The circuit of claim 1, further comprising, for each column, a plurality of memory cells clocked by an output of the analog-to-digital conversion circuit, wherein each memory cell of the plurality of memory cells receives a different bit of coded signal.

6. The circuit of claim 5, wherein the analog-to-digital conversion circuit, when enabled by the conversion enable signal, is configured to compare a voltage on the column line to a ramp signal, and wherein the coded signal varies corresponding to change in the ramp signal.

7. The circuit of claim 1, further comprising a logic circuit configured to logically combine the first and second output enable signals to generate the conversion enable signal.

8. The circuit of claim 7, wherein said logic circuit asserts the conversion enable signal only if both the first and second output enable signals are asserted.

* * * * *